United States Patent [19]

Maddocks

[11] 4,045,594
[45] Aug. 30, 1977

[54] PLANAR INSULATION OF CONDUCTIVE PATTERNS BY CHEMICAL VAPOR DEPOSITION AND SPUTTERING

[75] Inventor: Fred Sterns Maddocks, Poughkeepsie, N.Y.

[73] Assignee: IBM Corporation, Armonk, N.Y.

[21] Appl. No.: 645,772

[22] Filed: Dec. 31, 1975

[51] Int. Cl.² .......................................... B05D 5/12
[52] U.S. Cl. .................................... 427/89; 29/578; 29/579; 29/580; 29/589; 29/591; 96/36.2; 156/652; 156/653; 156/655; 156/657; 204/192 SP; 204/192 D; 427/90; 427/91; 427/94; 427/95; 427/96; 427/99; 427/126; 427/259; 427/264; 427/265; 427/266; 427/269; 427/270; 427/272; 427/282
[58] Field of Search ................... 156/3, 17, 11, 8, 644, 156/652, 653, 655, 657; 96/36.2; 427/88, 89, 90, 91, 93, 94, 95, 82, 123, 124, 85, 259, 261, 264, 265, 266, 269, 270, 271, 272, 275, 276, 282, 287; 204/192 SP, 192 D, 192 C; 29/576 R, 578, 579, 580, 589, 591

[56] References Cited
U.S. PATENT DOCUMENTS

| | | | |
|---|---|---|---|
| 3,498,833 | 3/1970 | Lehrer | 427/91 |
| 3,672,983 | 6/1972 | De Witt et al. | 427/94 |
| 3,763,408 | 10/1973 | Kano et al. | 357/71 |
| 3,858,304 | 1/1975 | Leedy et al. | 29/578 |
| 3,898,353 | 8/1975 | Napoli et al. | 156/11 |
| 3,920,861 | 11/1975 | Dean | 156/17 |
| 3,985,597 | 10/1976 | Zielinski | 96/36.2 |
| 3,993,515 | 11/1976 | Reichert | 427/91 |

Primary Examiner—Cameron K. Weiffenbach
Attorney, Agent, or Firm—Thomas F. Galvin

[57] ABSTRACT

A method using a chemically vapor deposited (CVD) insulator to form a substantially planar layer of insulative material atop a conductive pattern on the surface of a substrate. The invention also features the use of a photoresist both as a mask for forming apertures in an underlying insulating layer as well as a lift-off material for a subsequently deposited conductive layer.

In the method, a first insulating layer is deposited atop the substrate. Photoresist is then deposited; the resist pattern is exposed and developed; and the insulator is etched to expose selected areas of the substrate. A conductive film, preferably metal, is then deposited in blanket fashion in such quantity as to achieve the same height as the first insulator within the exposed apertures. The resist is lifted off, thereby leaving metal in the exposed apertures only. The pattern at this point consists of a single level of a conductive pattern and the insulator pattern with gaps between the conductors and the insulator. The gaps are the result of the unavoidable removal of a portion of the insulator below the photoresist during the etching process. Another insulating film is chemically vapor deposited (pyrolytically deposited) in blanket fashion. Notwithstanding the gaps between the conductors and first insulator, the second film is substantially planar if the thickness of this second insulating film equals or exceeds one-half the width of the largest of said gaps. The method is applicable to any level of conductive patterns (metallization) atop the substrate.

28 Claims, 17 Drawing Figures

PLANAR INSULATION OF CONDUCTIVE PATTERNS BY CHEMICAL VAPOR DEPOSITION AND SPUTTERING

BACKGROUND OF THE INVENTION

This invention relates to conductive layers formed atop substrates, e.g., semiconductor structures.

In particular, it relates to a method for forming a layer, or layers, of metallization so that the insulating layer covering each layer of metal is substantially planar with respect to the substrate.

In the usual methods of forming thin film integrated semiconductor circuits containing passivating or insulating films over raised conductive line patterns on a substrate, the film ordinarily follows the contours of the underlying metallization pattern. The insulating layer has raised portions or elevations corresponding to the pattern. In structures having several such layers of metallurgy, the elevated portions formed by the conductive lines at the locations where insulation passes over or under the lines are a principal cause of pinholes and stress cracks in the insulation layer as well as pinholes in the metallization. Moreover, the effect is cumulative and increases with the number of metallurgical levels atop the semiconductor.

Copending application Ser. No. 103,250 of R. P. Auyang et al, filed Dec. 31, 1970, and assigned to the assignee of the present invention, relates to a method for solving this problem. In that application, the insulating layer is sputtered quartz and the invention is a novel method for removing all elevations from the deposited quartz by resputtering to completely planarize the surface of the layer. The Auyang et al., technique has been eminently successful. However, it is time consuming; and planarization by resputtering alone is limited by the width of the metallic land pattern.

Thus, it may take as much as 24 hours of R. F. resputtering to completely planarize a conventional quartz layer deposited over a raised metallization pattern having stripes of standard width, say 300 to 1500 microinches. In addition, for large line widths, R. F. resputtering may not completely planarize the layer effectively. As disclosed in the Auyang et al. application, the resputtering may then be supplemented by a conventional chemical etching step on extremely wide stripes. This adds to the number of process steps required, hence to the cost of manufacturing. In addition, the passivation and insulation properties of sputtered quartz are not as good as desired. Moreover, sputtering equipment is complicated and expensive.

SUMMARY OF THE INVENTION

Accordingly, it is a primary object of the present invention to provide an improved method for forming substantially planar insulative conductive patterns atop substrates.

It is yet another object to use chemical vapor deposition rather than sputtering to deposit the insulator, thereby reducing the manufacturing costs.

In general, an insulator such as silicon dioxide ($SiO_2$) is deposited atop a substrate. A photoresist material which can be subsequently removed without affecting the $SiO_2$ is deposited atop the surface. The photoresist is developed to form a mask; and the photoresist and the $SiO_2$ are then etched to form windows for a conductive pattern, typically metal. The metal is then deposited in blanket fashion atop the photoresist as well as within the windows. For subsequent planarity, the metallization must be deposited so as to be substantially flush or planar with respect to the insulating layer.

The photoresist is then lifted off, thereby leaving metal in the windows only. The pattern as this point consists of a single level of metallic lines or stripes and a complementary insulator pattern. By the nature of the process, there are gaps between the metal and the insulator.

In the final step of the basic process, a second insulating film such as $SiO_2$ is chemically vapor deposited in blanket fashion atop the structure. If the thickness of this second insulator equals or exceeds one-half the width of the largest of said gaps, a substantially planar layer results. Planarity depends on the phenomenon that the insulator formed by the second deposition grows normal with respect to the surfaces of the first level insulation and metal, irrespective of the fact that the angles within the gaps are not parallel to the substrate. Methods for forming multiple levels of planar insulation by substantially the same technique are also described.

If the metallization deposited is of the high temperature type, such as Pt, Cr, Ta or W, then a high-temperature CVD process may be used. However, if the metallization is of the low temperature type, such as Al, then a low-temperature CVD process must be used.

DETAILED DESCRIPTION OF THE PREFERRED EMBODIMENTS

Figure 1A:
FIGS. 1A-1G are diagrammatic cross-sectional views of a structure being fabricated in accordance with the preferred embodiment of the present invention. The figures include a flow chart describing briefly each of the steps.

In FIG. 1A, a composite layer of silicon dioxide 4 and silicon nitride 6 as a diffusion mask is formed on a silicon semiconductor substrate 2. The thickness of conjoint layer 4/6 with respect to the layers to be deposited subsequently is insignificant. Typically, the thickness is around 0.18 micrometers. Apertures 5 are formed in the composite layer to provide contact openings to the semiconductor substrate. Typically, the substrate contains active regions of semiconductor impurities for the formation of transistors, diodes, resistors, and the like. These are not illustrated because in themselves they form no part of my invention and are quite conventional in the art.

The formation of conjoint layer 4/6 and the etching of windows therein is also quite conventional at this point in the semiconductor art. It is well known to use a conjoint layer of silicon dioxide and silicon nitride as a diffusion mask. Moreover, my invention is in no way limited to the use of a conjoint layer for such purposes. Any other passivating material known to the art which may be used as a diffusion mask, such as silicon dioxide alone or aluminum oxide, may be used for this purpose.

Figure 1B:
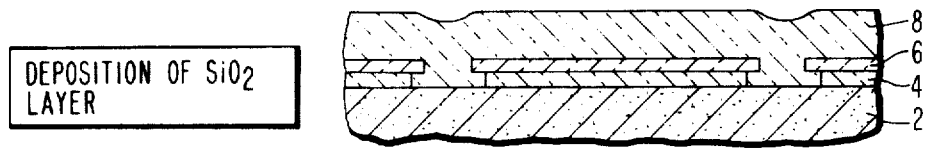

Next, as set forth in FIG. 1B, an insulating layer 8 which is preferably glass (SiO₂), is blanket deposited atop the surface of silicon nitride 6 as well as in the contact openings 5. The thickness of layer 8 is typically around 0.9 ± 0.05 micrometers.

Glass layer 8 may be deposited by conventional chemical vapor deposition (CVD) or RF or DC sputtering techniques which are now well known to those of the skill in the art. Chemical vapor deposition is also termed pyrolytic deposition.

One such conventional method for depositing CVD silicon dioxide films on a silicon substrate is described in the article "Pyrolytic Silica on Silicon Deposited from Silane and Carbon Dioxide," by Swann and Pyne in the Journal of the Electrochemical Society, 1969, pages 1014-1017. Using this technique, the silicon dioxide is deposited by a chemical-vapor method from a reaction mixture comprising silane or a silicon chloride source, an oxidizing agent such as carbon dioxide and a carrier gas such as hydrogen. The deposition is performed at a substrate temperature of above 700° C. Another such technique is described in U.S. Pat. No. 3,887,726 which has issued in the names of R. L. Bratter, et al., and is assigned to the assignee of the present application; this technique improves the Swann and Pyne technique by adding HCl from an external source to the reactants.

As previously indicated, layer 8 may also be formed by standard sputtering techniques or any other known method. It is most conveniently done by a chemical vapor deposition, because the subsequent deposition of another insulation layer must be done by chemical vapor deposition to fall within the scope of my invention.

As already noted, in the preferred embodiment of my invention, the thickness of silicon dioxide layer 8 is around 0.9 micrometers, but it could be larger. The thickness of this layer, although it may encompass a large range, must be known so that the subsequently deposited metallic pattern is substantially planar or flush therewith. The accurate thickness measurement of this film is quite standard in the art.

Figure 1C:
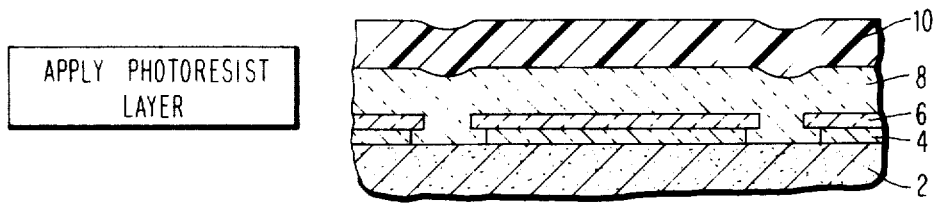
Figure 1D:
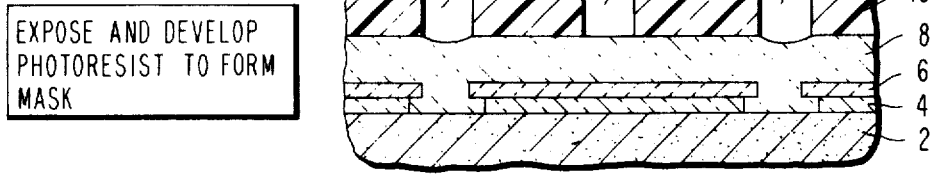

In the next step of the process as shown in FIG. 1C, a photoresist layer 10 is deposited atop glass layer 8. Photoresist 10 may be any conventional photoresist which is sensitive to actinic rediation or to an electron beam. I prefer to use types known as AZ 1350J or AZ 111 both of which are available from the Shipley Company. The photoresist is for the purpose both of forming contact openings to substrate 2 as well as metallization patterns atop the composite insulator 4/6. The technique for doing so comprises exposing and developing the photoresist to form a mask as shown in FIG. 1D. The developed mask covers the entire glass layer 8 except for windows 11, 12, and 13 where metallization is subsequently to be deposited. This is followed by etching glass layer 8 with a conventional etchant such as buffered HF. As a result, apertures corresponding to the windows are formed in glass layer 8.

Figure 1E:
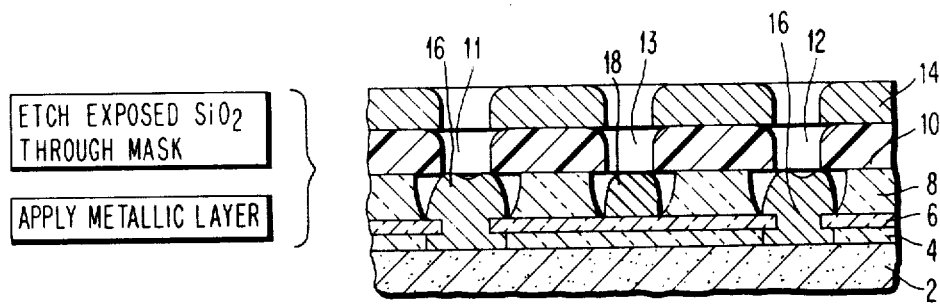

It is noted at this point that the buffered HF is isotropic and attacks the glass below the photoresist layer, thereby leaving an undercut. This undercutting is essentially unavoidable when using conventional photolithographic techniques and creates a problem upon the subsequent deposition of a conductive film which is shown in FIG. 1E. In this figure metallization is deposited by chemical vapor deposition techniques to form both a blanket layer 14 atop the photoresist layer 10 as well as contacts 16 and conductive land 18 within openings 11, 12, 13 respectively. Land 18 is a metallic stripe. Conductive film 14 may consist of any conventional metal used in integrated circuits, such as aluminum, aluminum-copper alloys, platinum, palladium, chromium, molydenum, etc. With respect to the contact openings to the semiconductor substrate, it is desirable to deposit initially thin layers of platinum followed by chrome to alloy with the silicon substrate prior to the deposition of the thicker layer metallization. It is important that the thickness of contacts 16 and land 18 be substantially the same as that of insulating layer 8, in this case 0.9 micrometers.

In the next step as shown in FIG. 1E, conventional lift-off removal techniques are used to remove photoresist layer 10. Lift-off may be accomplished by immersing the photoresist in a solvent for about 15 to 30 minutes. Those portions of metallic film 14 dispose atop photoresist layer 10 are also washed away. Other solvents such as trichloroethylene, ethyl methyl ketone, or acetone may be used.

Figure 1F:
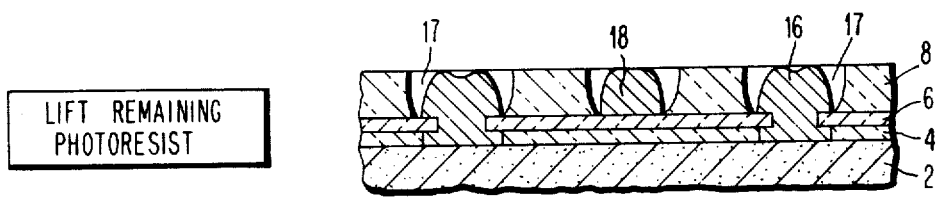

The structure at this point is shown in FIG. 1F and includes metallic films 16 and 18 which are substantially flush with respect to silicon dioxide layer 8. However, because of the undercutting of layer 8, there are gaps denoted by the numeral 17 between the metallization 16 and 18 and the insulator 8. Ordinarily, it would be expected that subsequent depositions of an insulator, such as SiO₂, either by sputtering or by chemical vapor deposition, would result in elevations in those portions of the glass atop the metallic layers. However, to avoid this problem and to assure that the subsequently deposited glass is substantially planar with respect to the substrate, all that is necessary is that the thickness of insulator 8' be equal to or greater than one-half the maximum width of the gaps.

Figure 1G:
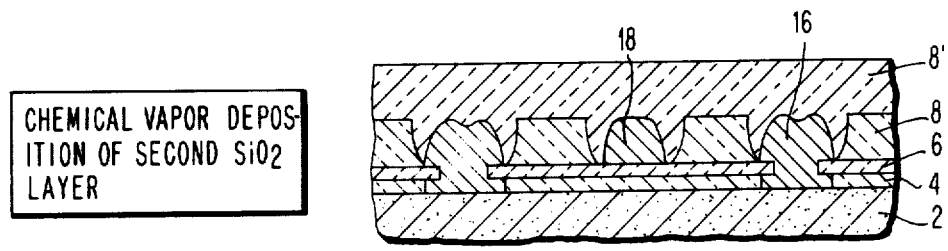

FIG. 1G shows the results of forming a second layer of silicon dioxide by a chemical vapor deposition technique where the desired planar property is realized. The second glass layer, denoted by the numeral 8', is substantially flush with substrate 2, i.e., planar.

The method of chemical vapor deposition to be used depends on the materials used for metallization 16. If only high-temperature materials such as Cr, Pt, Ta, or W are used, then the CVD deposition techniques already discussed may be employed. However, if a low-temperature metal such as Al is used, than a low-temperature CVD deposition process must be employed. Otherwise, the Al would migrate into the semiconductor material, causing defective devices. In the preferred low-temperature process, which is not my invention, a SiO₂ layer is formed by the reaction between silane and oxygen in a nitrogen carrier:

$$SiH_4 + O_2 \rightarrow SiO_2 + 2H_2$$

A commercially available Applied Materials SOX 10 System may be employed. Such a system is operated at 500° C and below, depending on the activation energy of the reaction. Wafer substrate temperatures may range from 330° to around 450° C, which is sufficiently low to preclude the migration of commonly used low temperature metals onto the semiconductor substrate.

Due to the fact that devices fabricated in semiconductor substrates are much longer and wider at the surface of the substrate than they are deep (thick) within the substrate, it has been the conventional practice to substantially reduce the horizontal dimension of drawings with respect to the vertical. This makes it difficult to illustrate the actual dimension of gaps 17 in FIG. 1F which remain between the insulating layer 8 and the metallization. In fact, the gap width is at least as large as, and may be as much as double, the thickness of layer 8, even though it appears to be insignificant in most published literature. Thus, in the present structure, with layer 8 being around 0.9 micrometers, gap 17 is between 0.9 and 1.8 micrometers wide. The gap is thus of substantial size and creates problems with respect to cracks which may form in layers deposited directly over the gaps.

Figure 2:
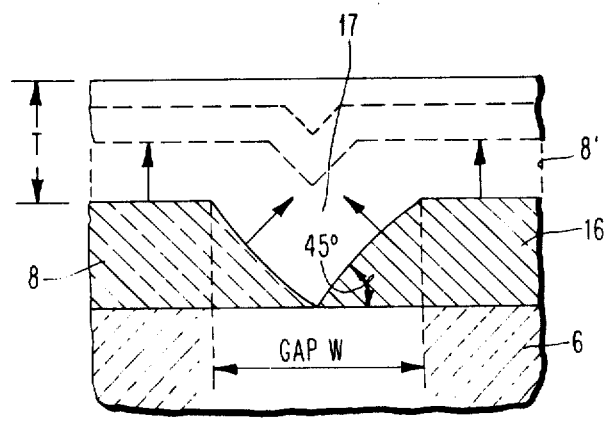
FIG. 2 is an expanded view of a gap between the metallic pattern and the initially deposited insulating layer which illustrates the growth of the second insulating layer as being normal, rather than vertical, with respect to the sides of the metal and first insulating layer.

FIG. 2 is an expanded view of a gap between a metallic contact 16 and the initially deposited insulating layer 8. During the chemical vapor deposition reaction for depositing insulating layer 8'; it grows normal with respect to the contours of layers 8 and 16, as shown in FIG. 2. This is illustrated by the arrows ↑ and means that more glass is deposited within the gaps than on the flat surfaces. If the thickness of layer 8', designated as T, is greater than one-half the total width, W, of the gap, then layer 8' is substantially planar at all locations. Thus, if the gap is 1.5 micrometers wide, the thickness of layer 8' must be at least 0.75 micrometers.

FIGS. 3A-3D illustrate a technique similar to that described heretofore to form a second layer of metallization which is substantially planar except in those areas where a connection is made between separate layers of metallization. The advantage of this particular process is that it uses a minimal number of steps which are substantially the same as have already been used to form the first level of metallization. For brevity and ease of understanding, it will be assumed that the first level has already been formed; and the subsequent steps are applied with respect to the structure illustrated in FIG. 1G.

An insulating layer 30 is deposited atop planar layer 8'. Layer 30 is preferrably silicon dioxide deposited to a thickness of around 1.3 micrometers by a chemical vapor deposition technique. The same restrictions already discussed with regard to the need for low-or high-temperature CVD processes, depending on the metal used, also apply here. RF or DC sputtering may also be used. As with the layer 8, however, it is more convenient to use chemical vapor deposition because the subsequently deposited layer 30' must be formed using that technique. The thickness of layer 30 must be known.

Figure 3A:
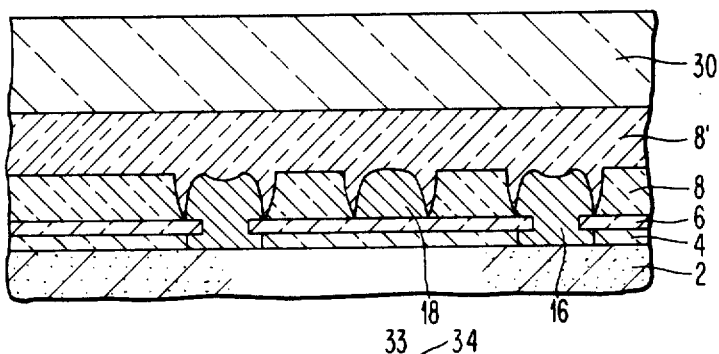
FIG. 3 and 4 illustrate alternate embodiments of the formation of multiple levels of metallization atop a semiconductor structure in accordance with my invention.
Figure 3B:
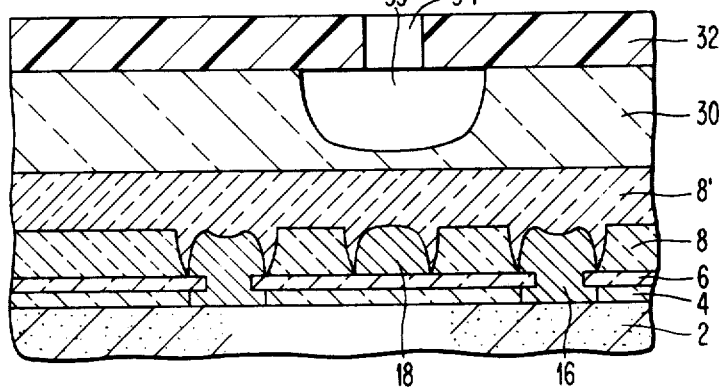
Figure 3C:
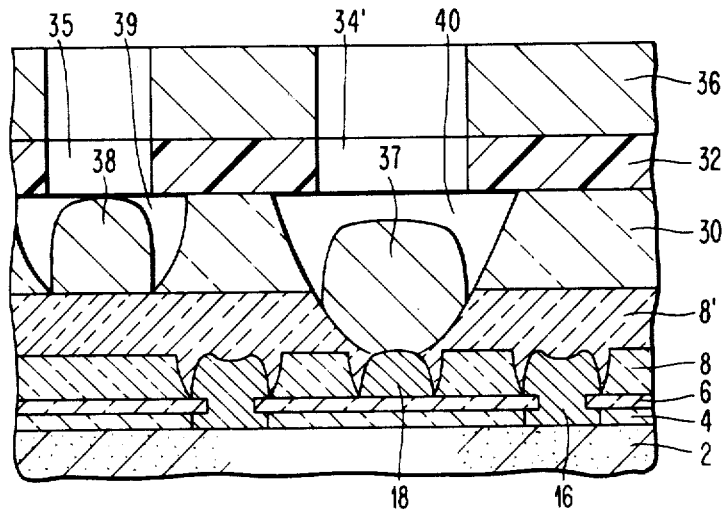

In FIG. 3B, a layer 32 of photoresist has been applied atop layer 30. As with photoresist layer 10 previously described, layer 32 is utilized as a mask for forming aperture 33 in layer 30. Thus, the photoresist is exposed and developed to form an initial aperture 33 in insulating layer 30. The depth of aperture 33 should be substantially the same as the thickness of layer 8', around 0.9 micrometers. The photoresist is then reexposed and redeveloped to form an increased area of aperture 34, denoted 34'; and also to form another aperture 35 as shown in FIG. 3C.

A second etching is then performed which removes insulation material which is equal to the thickness of layer 30. Apertures 39 and 40 are formed thereby. Because only a thickness of insulator 30 equal to the thickness of layer 8' is removed from aperture 33 in the first step, overetching of aperture 40 is avoided in the second etching step.

A metal layer 36 is then deposited in blanket fashion atop photoresist layer 32 and into apertures 39 and 40. They are formed thereby conductive lands 37 and 38 at a second level. Generally speaking, levels 37 and 38 are metal stripes which have a third dimension (not shown) into the drawing.

As previously mentioned photoresist layer 32 is exposed, masked and developed twice to allow separate formation of apertures 34 and 35. Thus, photoresist 32 must be of the type which maintains its photosensitivity after being exposed once so that it can be reexposed and redeveloped. The commercially available photoresist AZ 1350J has this property. Other photoresists may also be used. Practically speaking, however, the photoresist must be positive rather than negative, as negative photoresists polymerize upon exposure to light. Another photoresist which is useful is the type known as AZ 111 which is also available from the Shipley Company.

The double exposure of photoresist in fabricating thin films is already known in the art. See, e.g., the articles by Feder et al. entitled: "Single Exposure System for Multilevel Metallurgy", IBM Technical Disclosure Bulletin, January 1975, pp. 2460-2461 and Weaver, "Lift-off Method of Fabricating Thin Films," IBM Technical Disclosure Bulletin, July 1974, pp. 351-352. However, to my knowledge it has not been used heretofore to form apertures of varying depths in an insulating layer.

My preferred process for the dual exposure of photoresist layer 32 is as follows: AZ 1350 photoresist is initially spun on and baked. A chrome mask is applied over the photoresist; the mask is opaque except in those locations where window 34 (or windows) is to be formed. Thus, the first mask contains a pattern which will cause opening 34 to be formed in photoresist layer 32. The photoresist and the overlying mask are then exposed to ultraviolet light and the exposed photoresist "solubilizes". The exposed resist film is then developed, i.e., dissolved, to leave aperture 34 in photoresist film 32. Buffered HF is then used to etch aperture 33 in $SiO_2$ layer 30 as shown in FIG. 3B. Because the buffered HF and other common etchants tend to etch isotropically, aperture 33 is generally spherical in shape and there is a substantial amount of undercutting below photoresist layer 32.

A second chrome mask is then placed atop photoresist layer 32; the mask is opaque except where windows 34' and 35 are to be formed as shown in FIG. 3C. The mask and photoresist 32 are again exposed to ultraviolet light; and the photoresist is developed so that apertures 34' and 35 remain in photoresist layer 32. Buffered HF is again used to etch apertures 39 and 40 in the insulating layers.

In the second etching step, aperture 39 is formed completely through insulating layer 30; and a like amount of material is removed from aperture 40. Thus, the initial etching step which forms aperture 33 in FIG. 3B must be carefully controlled so that the amount of insulating material remaining above conductive land 18 equals the depth of layer 30. This is easily obtained using modern processing techniques.

Returning to FIG. 3C, a blanket layer of metallization 36 is then deposited atop photoresist layer 32 and within apertures 39 and 40. Conductors 37 and 38 are thereby formed within apertures 39 and 40. Although not shown in the drawing, conductive lands 37 and 38 are generally metal stripes having significant lengths atop the substrate.

Figure 3D:
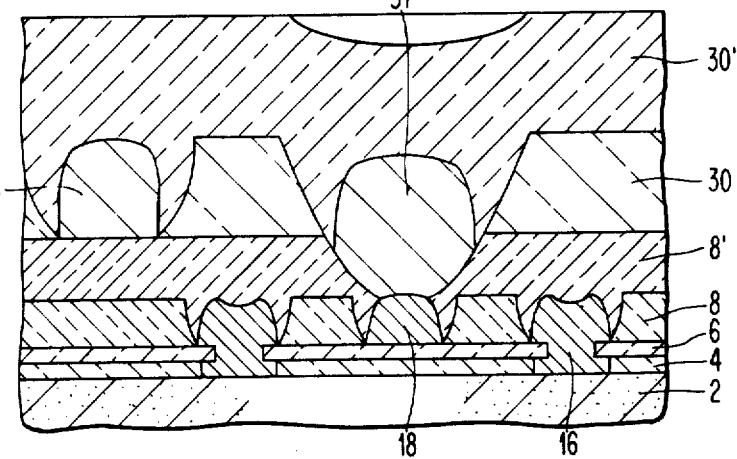

In the next step of process, photoresist layer 32 is removed, which also causes metal layer 36 to be removed. In accordance with my invention, insulating layer 30' is deposited atop layer 30 so as to fill in the gaps as illustrated in FIG. 3D. That portion of glass layer 30' above conductive land 38 is thereby substantially flush with respect to layer 8'. However, because the upper surface of land 37 is below the upper surface of land 38, layer 30' is depressed at the region above land 37. Such a depression may not be significant in certain structures. In any event, the thickness of layer 30' must be at least one-half the width of the largest gap between the metal lands 37 and 38 and insulating layer 30 in accordance with my invention.

Although I have described a single photoresist system to achieve the multilevel metallurgy in FIGS. 3B and 3C, it is also possible to use two separate photoresist applications. In this instance a first photoresist layer would be used to form aperture 33 in FIG. 3B and a separate, second photoresist layer would be used to form apertures 39 and 40. This is difficult to achieve in practice because of the difficulty of aligning the second mask accurately with respect to the first aperture, particularly in complex patterns.

FIGS. 4A–4E illustrate another technique which uses substantially the same steps as heretofore described to form a second, substantially planar layer of metallization. For brevity and ease of understanding, it will be assumed that the first level has already been formed; and the subsequent steps will be applied with respect to the structure illustrated in FIG. 1G. The process to be described with respect to FIGS. 4A–4E is not as desirable as that described previously with respect to FIGS. 3A–3D. This is because the former requires more process steps; however, it does result in a surface which is planar throughout.

A layer 50 of photoresist is applied atop planar glass layer 8'. Photoresist layer 50 is utilized as a mask for forming one or more apertures at desired locations in glass layer 8' in the manner already described with respect to FIGS. 1C and 1D, above, for the first level. Thus, the photoresist is exposed and developed to conform to the desired pattern. An aperture is etched in photoresist layer 50, illustrated by the numeral 54 in FIG. 4B. Obviously, other such apertures may also be formed. A metallic layer 52 is subsequently deposited in blanket fashion atop the photoresist layer and into the aperture 54 atop electrode 18. There is formed thereby a via stud connection 55 to interconnect conductor 18 to a second level of metallization to be deposited. Connections could also be made in like fashion to ohmic contacts 16 if the electrode pattern were designed for this type of connection. To assure planarity, the thickness of metallic layer 55 must equal the thickness of glass layer 8'.

As in the previous step of forming the first layer of metallization, there are gaps denoted by the numeral 57 under photoresist layer 50 which would ordinarily result in depressions in the subsequently formed insulating layer.

In the next step, photoresist layer 50 is removed to thereby lift-off metallic layer 52. In accordance with the invention, glass layer 56 is then chemically vapor deposited atop glass layer 8' so as to fill in the gaps 57 as well as achieving planarity. This is done, as previously described, by insuring that the thickness of glass layer 56 is at least one-half the width of the largest gap 56 which may appear. This completes the formation of via connection 55 between the first level of metallization and a second level which is to be deposited subsequently in FIGS. 4D and 4E.

Figure 4A:
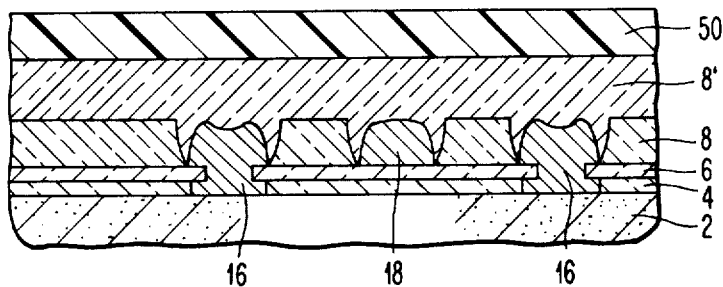
Figure 4B:
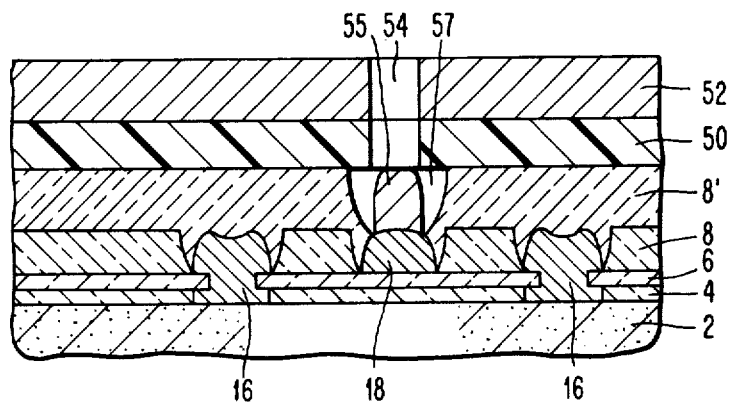
Figure 4C:
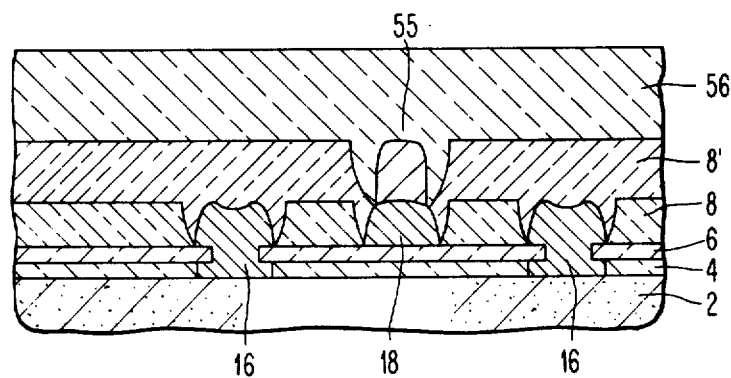
Figure 4D:
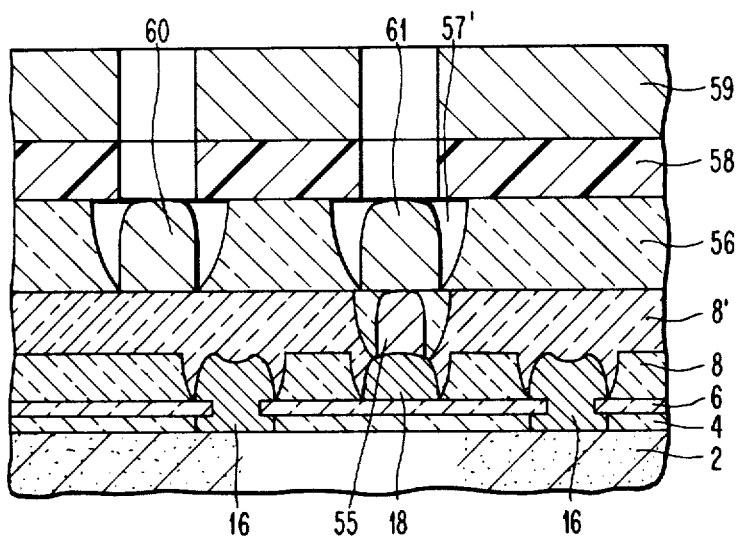
Figure 4E:
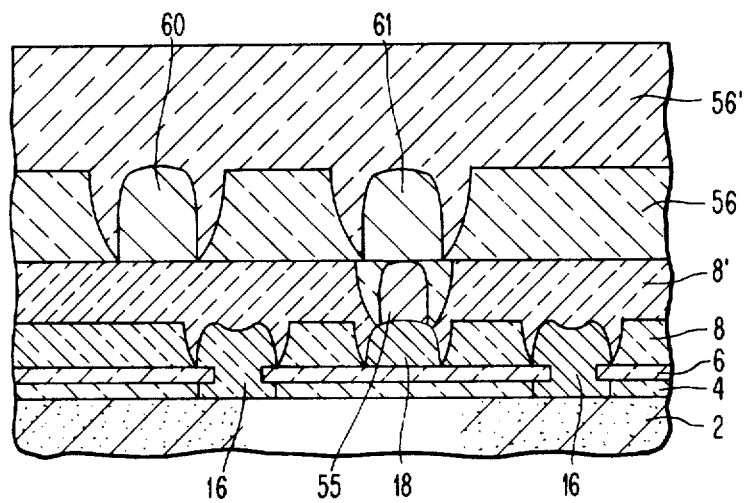

The second level of metallization is illustrated by numerals 60 and 61. Both are conductive lands or stripes. Land 61 is connected to stud 55, which acts as an via connection layer between the first and second levels of metallization. As shown in FIG. 4D, the lift-off resist is used to provide a mask for insulating layer 56, in which apertures are made to receive the metallization 59 deposited in blanket fashion atop the photoresist layer. As in the previous steps, lands 60 and 61 must have the same thickness as layer 56. The lift-off material 58 is removed, also removing excess metal 59. Finally, layer 56' is then deposited by a chemical vapor deposition technique to form the planar second level of metallization. Its thickness must be greater than one-half the width of the gaps 57'.

While the invention has been particularly shown and described with reference to preferred embodiments thereof, it will be understood by those skilled in the art that the forgoing and other changes in form and details may be made therein without departing from the spirit and scope of the invention.

For example, my technique is useful for very complex metallurgical patterns and is applicable for three or more levels metallurgy. In addition, it can be used in combination with other techniques where substrate planarity of all insulators may not be required.

What is claimed is:

1. A method for forming a conductive pattern atop a substrate comprising:
    forming a first insulating film on said substrate;
    forming a masking layer of photosensitive material on said first insulating film, said masking layer having at least one aperture;
    forming apertures in said first insulating film corresponding to said masking-layer apertures;
    depositing a conductive film atop said masking layer and into said apertures, the surface of said conductive film in said apertures being substantially flush with the surface of said first insulating film;
    said deposition resulting in gaps between said conductive film in said apertures and insulating film;
    removing said masking layer, thereby leaving a conductive pattern in said apertures;
    forming on said first insulating film and said conductive pattern a second insulating film by a chemical vapor deposition reaction;
    said second insulating film having a thickness which is at least one-half that of the width of the largest of said gaps, whereby a substantially planar second insulating film is formed.

2. A method as in claim 1 wherein said substrate is selected from the group consisting of silicon, silicon dioxide, silicon nitride, and aluminum oxide.

3. A method as in claim 1 wherein said first insulating film is deposited by a chemical vapor deposition reaction.

4. A method as in claim 1 wherein said first insulating film is deposited by sputtering.

5. A method as in claim 1 wherein said substrate is a semiconductor containing active devices therein and further comprising the step of:
    forming on said substrate, prior to the forming of said first insulating film, a diffusion mask having openings therein for allowing contacts to be made between said conductive film and said active devices.

6. A method as in claim 5 wherein said conductive film contains a low temperature metal and said chemical vapor deposition reaction is performed at a low temperature.

7. A method as in claim 6 wherein said second insulating film is silicon dioxide.

8. A method for forming multiple levels of conductive patterns atop a substrate comprising:
forming a first insulating film on said substrate;
forming a first masking layer of photosensitive material on said first insulating film, said masking layer having at least one aperture;
forming apertures in said first insulating film corresponding to said first-masking-layer apertures, thereby forming a first aperture pattern;
depositing a first conductive film atop said first masking layer and in said first aperture pattern, the surface of the conductive film in said apertures being substantially flush with the surface of said first insulating film;
said deposition resulting in gaps between said conductive film in said first apertures and said first insulating film;
removing said first masking layer, thereby leaving a first conductive pattern in said first aperture pattern;
forming on said first insulating film and said first conductive pattern a second insulating film of known thickness by a chemical vapor deposition reaction;
said second insulating film having a thickness which is at least one-half that of the width of the largest of said gaps, whereby a substantially planar second insulating layer is formed;
forming a third insulating film of known thickness on said second insulating film;
forming a second layer of photosensitive material on said third insulating film, said second photosensitive material having the property of maintaining its photosensitivity after being exposed once;
forming apertures corresponding to a second aperture pattern in said second photosensitive material by masking, exposing and developing said material;
forming apertures in said third insulating film corresponding to said second aperture pattern;
forming apertures corresponding to a third aperture pattern in said second photosensitive material by remasking, reexposing and redeveloping said material;
said third aperture pattern including the second aperture pattern;
forming apertures in said second and third insulating films corresponding to said third aperture pattern;
depositing a second conductive film atop said masking layer and in said third aperture pattern;
said deposition resulting in gaps between said conductive film in said third aperture pattern and said third insulating film;
removing said second layer of photosensitive material, thereby leaving a second conductive pattern in said third aperture pattern;
forming on said third insulating film and said second conductive pattern a fourth insulating film by a chemical vapor deposition reaction;
said second insulating film having a thickness which is at least one-half that of the width of the largest of said gaps.

9. A method as in claim 8 wherein said substrate is selected from the group consisting of silicon, silicon dioxide, silicon nitride, and aluminum oxide.

10. A method as in claim 8 wherein said first and third insulating films are deposited by a chemical vapor deposition reaction.

11. A method as in claim 8 wherein said first and third insulating films are deposited by sputtering.

12. A method as in claim 8 wherein said substrate is a semiconductor containing active devices therein and further comprising the step of:
forming on said substrate, prior to the forming of said first insulating film, a diffusion mask having openings therein for allowing contacts to be made between said conductive film and said active devices.

13. A method as in claim 12 wherein said conductive film contains a low temperature metal and said chemical vapor deposition reaction is performed at a low temperature.

14. A method as in claim 13 wherein said second and fourth insulating films are silicon dioxide.

15. A method for forming multiple levels of conductive patterns atop a substrate comprising:
forming a first insulating film on said substrate;
forming a first masking layer of photosensitive material on said first insulating film, said masking layer having at least one aperture;
forming apertures in said first insulating film corresponding to said first-masking-layer apertures, thereby forming a first aperture pattern;
depositing a first conductive film atop said first masking layer and in said first aperture pattern, the surface of the conductive film in said first aperture pattern being substantially flush with the surface of said first insulating film;
said deposition resulting in gaps between said conductive film in said first aperture pattern and said first insulating film;
removing said first masking layer, thereby leaving a first conductive pattern in said first aperture pattern;
forming on said first insulating film and said first conductive pattern a second insulating film of known thickness by a chemical vapor deposition reaction;
said second insulating film having a thickness which is at least one-half that of the width of the largest of said gaps, whereby a substantially planar second insulating layer is formed;
forming a second masking layer of photosensitive material on said second insulating layer, said masking layer having at least one aperture over said first conductive pattern;
forming apertures in said second insulating film corresponding to said second masking-layer-apertures to expose at least a portion of said first conductive pattern, thereby forming a second aperture pattern;
depositing a second conductive film atop said second masking layer and in said second apertures pattern, the surface of said second conductive film in said apertures being substantially flush with the surface of said second insulating film;
said deposition resulting in gaps between said second conductive film in said second apertures and said second insulating film;
removing said second masking layer, thereby leaving a second conductive pattern in said second aperture pattern;

forming on said second insulating film and said second conductive pattern a third insulating film by a chemical vapor deposition reaction;

said third insulating film having a thickness which is at least one-half that of the width of the largest of said gaps, whereby a substantially planar third insulating film is formed.

16. A method as in claim 11 wherein said substrate is selected from the group consisting of silicon, silicon dioxide, silicon nitride, and aluminum oxide.

17. A method as in claim 15 wherein said first insulating film is deposited by a chemical vapor deposition reaction.

18. A method as in claim 15 wherein said first insulating film is deposited by sputtering.

19. A method as in claim 11 wherein said substrate is a semiconductor containing active devices therein and further comprising the step of:

forming on said substrate, prior to the forming of said first insulating film, a diffusion mask having openings therein for allowing contacts to be made between said conductive film and said active devices.

20. A method as in claim 19 wherein said conductive film contains a low temperature metal and said chemical vapor deposition reactions are performed at a low temperature.

21. A method as in claim 20 wherein said second and third insulating films are silicon dioxide.

22. A method as in claim 15 and further comprising the steps of:

forming a third masking layer of photosensitive material on said third insulating film, said third masking layer having at least one aperture over said second conductive pattern;

forming apertures in said third insulating film corresponding to said third-masking-layer apertures to expose at least a portion of said second conductive pattern, thereby forming a third aperture pattern;

depositing a third conductive film atop said third masking layer and in said third aperture pattern, the surface of said third conductive film in said apertures being substantially flush with said third insulating film;

said deposition resulting in gaps between said third conductive film in said apertures and said third insulating film;

removing said third masking layer, thereby leaving a third conductive pattern in said third aperture pattern;

forming on said third insulating film and said third conductive pattern a fourth insulating film by a chemical vapor deposition reaction;

said fourth insulating film having a thickness which is at least one-half that of the width of said gaps, whereby a substantially planar fourth insulating film is formed.

23. A method as in claim 22 wherein said substrate is selected from the group consisting of silicon, silicon dioxide, silicon nitride, and aluminum oxide.

24. A method as in claim 22 wherein said first insulating film is deposited by a chemical vapor deposition reaction.

25. A method as in claim 22 wherein said first insulating film is deposited by sputtering.

26. A method as in claim 22 wherein said substrate is a semiconductor containing active devices therein and further comprising the step of:

forming on said substrate, prior to the forming of said first insulating film, a diffusion mask having openings therein for allowing contacts to be made between said conductive film and said active devices.

27. A method as in claim 26 wherein said conductive film contains a low temperature metal and said chemical vapor deposition reaction is performed at low temperature.

28. A method as in claim 27 wherein said second, third and fourth insulating films are silicon dioxide.

* * * * *